United States Patent
Gu et al.

(10) Patent No.: US 10,268,306 B2
(45) Date of Patent: Apr. 23, 2019

(54) SHIFT REGISTER UNIT, ITS DRIVING METHOD, GATE DRIVER CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Honggang Gu, Beijing (CN); Xianjie Shao, Beijing (CN); Xiaohe Li, Beijing (CN); Zhangmeng Wang, Beijing (CN); Jie Song, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 153 days.

(21) Appl. No.: 15/289,177

(22) Filed: Oct. 9, 2016

(65) Prior Publication Data

US 2017/0199617 A1    Jul. 13, 2017

(30) Foreign Application Priority Data

Jan. 12, 2016   (CN) .......................... 2016 1 0019068

(51) Int. Cl.
*G11C 19/00*    (2006.01)
*G06F 3/041*    (2006.01)
(Continued)

(52) U.S. Cl.
CPC .......... *G06F 3/0416* (2013.01); *G06F 3/0412* (2013.01); *G09G 3/3677* (2013.01);
(Continued)

(58) Field of Classification Search
None
See application file for complete search history.

(56) References Cited

U.S. PATENT DOCUMENTS 9,824,659 B2 * 11/2017 Gu ....................... G09G 3/3677
2014/0292629 A1   10/2014 Umezaki
(Continued)

FOREIGN PATENT DOCUMENTS

| CN | 103943083 A | 7/2014 |
|---|---|---|
| CN | 104036738 A | 9/2014 |

(Continued)

OTHER PUBLICATIONS

Chinese Office Action for Chinese Application No. 201610019068. 3, English Translation attached to original document, Completed by the Chinese Patent Office, dated Aug. 9, 2016, All together 11 Pages.

(Continued)

*Primary Examiner* — Tuan T Lam
(74) *Attorney, Agent, or Firm* — Brooks Kushman P.C.

(57) ABSTRACT

A shift register unit is provided. The shift register unit includes a precharging module, a resetting module, a pull-up control module and a noise reduction module. The precharging module is connected to the resetting module and a pull-up node, the resetting module is connected to the pull-up node, the noise reduction module and an output end, the pull-up control module is connected to the pull-up node, the noise reduction module and the output end, and the noise output module is connected to the output end.

19 Claims, 6 Drawing Sheets

(51) Int. Cl.
    *G09G 3/36*     (2006.01)
    *G11C 19/28*     (2006.01)

(52) U.S. Cl.
    CPC ... *G11C 19/287* (2013.01); *G09G 2300/0408* (2013.01); *G09G 2310/0286* (2013.01); *G09G 2354/00* (2013.01); *G11C 19/28* (2013.01)

(56) References Cited

U.S. PATENT DOCUMENTS

| | | | |
|---|---|---|---|
| 2015/0346904 A1* | 12/2015 | Long | G09G 3/3677 345/174 |
| 2015/0371716 A1* | 12/2015 | Shao | G11C 19/287 345/100 |
| 2016/0049126 A1 | 2/2016 | Zhang et al. | |
| 2016/0246418 A1* | 8/2016 | Wang | G11C 19/28 |
| 2016/0266699 A1* | 9/2016 | Zhao | G09G 3/3677 |
| 2016/0275902 A1 | 9/2016 | Xue et al. | |
| 2017/0010731 A1 | 1/2017 | Zhang et al. | |
| 2017/0102801 A1* | 4/2017 | Ko | G06F 3/044 |
| 2017/0102814 A1* | 4/2017 | Xu | G06F 3/0412 |
| 2017/0108989 A1* | 4/2017 | Gu | G06F 3/0412 |
| 2017/0123556 A1* | 5/2017 | Lin | G06F 3/0412 |
| 2017/0221441 A1* | 8/2017 | Gu | G09G 3/3648 |
| 2017/0269769 A1* | 9/2017 | Hu | G06F 3/0416 |
| 2017/0287428 A1 | 10/2017 | Xue et al. | |
| 2017/0364170 A1* | 12/2017 | Gu | G06F 3/041 |
| 2018/0046311 A1* | 2/2018 | Gu | G06F 3/0416 |

FOREIGN PATENT DOCUMENTS

| | | |
|---|---|---|
| CN | 104217763 A | 12/2014 |
| CN | 104658506 A | 5/2015 |
| CN | 105047168 | 11/2015 |
| CN | 105185343 | 12/2015 |
| CN | 105185345 A | 12/2015 |

OTHER PUBLICATIONS

Chinese Office Action for Chinese Application No. 201610019068.3, English Translation attached to original document, Completed by the Chinese Patent Office, dated Oct. 27, 2016, All together 11 Pages.

Third Office Action for Chinese Application No. 201610019068.3, dated Jun. 25, 2018, 9 Pages.

* cited by examiner

SHIFT REGISTER UNIT, ITS DRIVING METHOD, GATE DRIVER CIRCUIT AND DISPLAY DEVICE

CROSS-REFERENCE TO RELATED APPLICATIONS

The present application claims a priority of the Chinese patent application No. 201610019068.3 filed on Jan. 12, 2016, which is incorporated herein by reference in its entirety.

TECHNICAL FIELD

The present disclosure relates to the field of display technology, in particular to a shift register unit, its driving method, a gate driver circuit and a display device.

BACKGROUND

Along with the wide application of liquid crystal display devices, currently a high-resolution and a narrow-bezel liquid crystal display device has become a mainstream product. A driver circuit of the liquid crystal display device mainly includes a data driver circuit and a gate driver circuit, and the gate driver circuit may be configured to provide the liquid crystal display device with a high-resolution and narrow-bezel display function. The gate driver circuit may be arranged in a display panel through such a packaging mode as Chip on Film (COF) or Chip on Glass (COG), or may be arranged in the display panel through an integrated circuit unit including thin film transistors (TFTs). Usually, an electrode of a shift register unit is connected to one gate line, and a signal is inputted to the gate line through the gate driver circuit, so as to progressively scan pixels. As compared with the conventional COF or COG design, it is able for the gate driver circuit of the integrated circuit including the TFTs to reduce the production cost of the liquid crystal display device, reduce one process step and improve the yield.

A touch panel has been widely used due to its advantages such as usability, multi-functionality, increasingly-reduced price and increasingly-improved yield. The touch panel may include an add-on touch panel and a built-in touch panel. The built-in touch panel may include an in-cell touch panel and an on-cell touch panel.

In the case that the gate driver circuit is used for the in-cell touch panel, a driving signal from the gate driver circuit may interfere with a touch signal, and as a result, a touch function of the touch panel will be adversely affected.

SUMMARY

An object of the present disclosure is to provide a shift register unit, its driving method, a gate driver circuit and a display device, so as to prevent a touch function of the display device from being adversely affected.

In one aspect, the present disclosure provides in some embodiments a shift register unit, including a precharging module, a resetting module, a pull-up control module and a noise reduction module. The precharging module is connected to the resetting module and a pull-up node, the resetting module is connected to the pull-up node, the noise reduction module and an output end, the pull-up control module is connected to the pull-up node, the noise reduction module and the output end, and the noise reduction module is connected to the output end. The precharging module is configured to charge the pull-up node at a precharging stage. The noise reduction module is configured to perform noise reduction on the output end at a touch stage. The pull-up control module is configured to pull up a potential at the pull-up node and output a driving signal through the output end at the output stage. The resetting module is configured to reset the pull-up node and the output end at a resetting stage, and perform noise reduction on the pull-up node and the output end at a noise reduction stage.

Optionally, the shift register unit further includes a compensation module connected to the pull-up node and configured to charge the pull-up node at the touch stage.

Optionally, the shift register unit further includes a pull-down control module connected to the pull-up node, a pull-down node and the resetting module, and configured to pull down a potential at the pull-down node.

Optionally, during forward scanning, the precharging module includes a first transistor, a gate electrode of which is connected to a signal input end, a first electrode of which is connected to a first power supply, and a second electrode of which is connected to the pull-up node.

Optionally, during the forward scanning, the resetting module includes a second transistor, a fourth transistor, a seventh transistor, an eighth transistor, a ninth transistor and a tenth transistor. A gate electrode of the second transistor is connected to a resetting signal end, a first electrode thereof is connected to the pull-up node, and a second electrode thereof is connected to a second power supply. A gate electrode of the fourth transistor is connected to the pull-down node, a first electrode thereof is connected to the pull-up control module, the output end and the noise reduction module, and a second electrode thereof is connected to a third power supply and the noise reduction module. A gate electrode of the seventh transistor is connected to the pull-up node, a first electrode thereof is connected to a gate electrode of the eighth transistor and a second electrode of the ninth transistor, and a second electrode thereof is connected to the third power supply. The gate electrode of the eighth transistor is connected to the second electrode of the ninth transistor, a first electrode thereof is connected to a fourth power supply and a gate electrode of the ninth transistor, and a second electrode thereof is connected to the pull-down node. The gate electrode of the ninth transistor is connected to a first electrode of the ninth transistor and the fourth power supply. A gate electrode of the tenth transistor is connected to the pull-down node, a first electrode thereof is connected to the pull-up node, and a second electrode thereof is connected to the third power supply.

Optionally, during backward scanning, the precharging module includes a second transistor, a gate electrode of which is connected to a resetting signal end, a first electrode of which is connected to the pull-up node, and a second electrode of which is connected to a second power supply.

Optionally, during backward scanning, the resetting module includes a first transistor, a fourth transistor, a seventh transistor, an eighth transistor, a ninth transistor and a tenth transistor. A gate electrode of the first transistor is connected to a signal input end, a first electrode thereof is connected to a first power supply, and a second electrode thereof is connected to the pull-up node. A gate electrode of the fourth transistor is connected to the pull-down node, a first electrode thereof is connected to the pull-up control module, the output end and the noise reduction module, and a second electrode thereof is connected to a third power supply and the noise reduction module. A gate electrode of the seventh transistor is connected to the pull-up node, a first electrode thereof is connected to a gate electrode of the eighth transistor and a second electrode of the ninth transistor, and a second transistor thereof is connected to the third power supply. The gate electrode of the eighth transistor is connected to the second electrode of the ninth transistor, a first electrode thereof is connected to a fourth power supply and a gate electrode of the ninth transistor, and a second electrode thereof is connected to the pull-down node. The gate electrode of the ninth transistor is connected to a first electrode of the ninth transistor and the fourth power supply. A gate electrode of the tenth transistor is connected to the pull-down node, a first electrode thereof is connected to the pull-up node, and a second electrode thereof is connected to the third power supply.

Optionally, the pull-up control module includes a third transistor and a capacitor. A gate electrode of the third transistor is connected to the pull-up node, a first electrode thereof is connected to a clock signal end, and a second electrode thereof is connected to a second end of the capacitor, the output end and the noise reduction module. A first end of the capacitor is connected to the pull-up node, and the second end thereof is connected to the output end, the resetting module and the noise reduction module.

Optionally, the noise reduction module includes a fifth transistor, a gate electrode of which is connected to a switch power supply, a first electrode of which is connected to the resetting module, the output end and the pull-up control module, and a second electrode of which is connected to the resetting module and the third power supply.

Optionally, the compensation module includes an eleventh transistor and a twelfth transistor. A gate electrode of the eleventh transistor is connected to a second electrode of the twelfth transistor, a first electrode thereof is connected to the switch power supply and a first electrode of the twelfth transistor, and a second electrode thereof is connected to the pull-up node. A gate electrode of the twelfth transistor is connected to the pull-up node, and the first electrode thereof is connected to the switch power supply.

Optionally, the pull-down control module includes a sixth transistor, a gate electrode of which is connected to the pull-up node, a first electrode of which is connected to the pull-down node, and a second electrode of which is connected to the third power supply.

In another aspect, the present disclosure provides in some embodiments a gate driver circuit, including a plurality of the above-mentioned shift register units connected in a cascaded manner.

Optionally, a start signal is inputted to an input end of a first-level shift register unit. Apart from the first-level shift register unit, an input end of a current-level shift register unit is connected to an output end of a previous-level shift register unit, and a resetting end RESET of a last-level shift register unit is configured to receive a reset signal. Apart from the last-level shift register unit, a resetting end of a current-level shift register unit is connected to an output end of a next-level shift register unit.

In yet another aspect, the present disclosure provides in some embodiments a display device including the above-mentioned gate driver circuit.

In still yet another aspect, the present disclosure provides in some embodiments a method for driving a shift register unit, including steps of: at a precharging stage, charging, by a precharging module, a pull-up node; at a touch stage, performing, by a noise reduction module, noise reduction on an output end; at an output stage, pulling up, by a pull-up control module, a potential at the pull-up node, and outputting a driving signal through the output end; and at a resetting stage, resetting, by a resetting module, the pull-up node and the output end, and at a noise reduction stage, performing noise reduction on the pull-up node and the output end.

Optionally, the touch stage is a horizontal blanking stage.

In still yet another aspect, the present disclosure provides in some embodiments a method for driving a shift register unit, including steps of: at a precharging stage, charging, by a precharging module, a pull-up node; at an output stage, pulling up, by a pull-up control module, a potential at the pull-up node, and outputting a driving signal through an output end; at a resetting stage, resetting, by a resetting module, the pull-up node and the output end, and at a noise reduction stage, performing noise reduction on the pull-up node and the output end; and at a touch stage, performing, by a noise reduction module, on the output end.

Optionally, the touch stage is a vertical blanking stage.

According to the shift register unit, its driving method, the gate driver circuit and the display device in the embodiments of the present disclosure, the shift register unit includes the precharging module, the resetting module, the pull-up control module and the noise reduction module, and the noise reduction module is configured to perform noise reduction on the output end at the touch stage. As a result, it is able to prevent the driving signal from the output end from interfering with a touch signal, thereby to prevent a touch function of the display device from being adversely affected.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The present disclosure will be described hereinafter in conjunction with the drawings and embodiments. The following embodiments are for illustrative purposes only, but shall not be used to limit the scope of the present disclosure.

Figure 1:
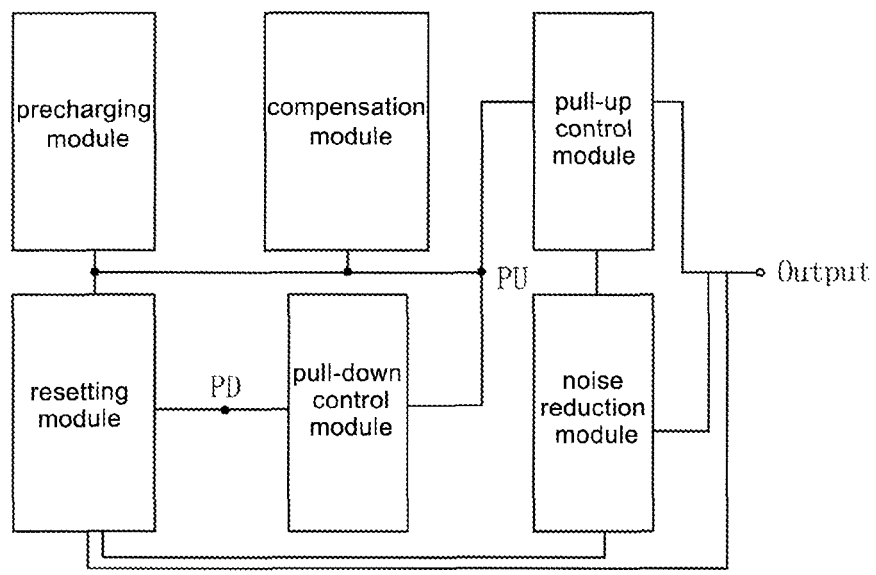
FIG. 1 is a schematic view showing a shift register unit according to the first embodiment of the present disclosure.

As shown in FIG. 1, which is a schematic view showing a shift register unit according to the first embodiment of the present disclosure, the shift register unit includes a precharging module 1, a resetting module 2, a pull-up control module 3 and a noise reduction module 4. The precharging module 1 is connected to the resetting module 2 and a pull-up node PU, the resetting module 2 is connected to the pull-up node PU, the noise reduction module 4 and an output end Output, the pull-up control module 3 is connected to the pull-up node PU, the noise reduction module 4 and the output end Output, and the noise output module 4 is connected to the output end Output.

The precharging module 1 is configured to charge the pull-up node at a precharging stage. The noise reduction module 4 is configured to perform noise reduction on the output end at a touch stage. The pull-up control module 3 is configured to pull up a potential at the pull-up node at the output stage, and output a driving signal through the output end. The resetting module 2 is configured to reset the pull-up node PU and the output end Output at a resetting stage, and perform noise reduction on the pull-up node PU and the output end Output at a noise reduction stage.

The shift register unit further includes a compensation module 5 connected to the pull-up node PU and configured to charge the pull-up node at the touch stage.

The shift register unit further includes a pull-down control module 6 connected to the pull-up node PU and a pull-down node PD, and configured to pull down a potential at the pull-down node PD. The resetting module 2 is further connected to the pull-down node PD.

According to the shift register unit in the embodiments of the present disclosure, the shift register unit includes the precharging module, the resetting module, the pull-up control module and the noise reduction module, and the noise reduction module is configured to perform noise reduction on the output end at the touch stage. As a result, it is able to prevent the driving signal of the output end from interfering with a touch signal, thereby to prevent a touch function of the display device from being adversely affected.

Figure 2:
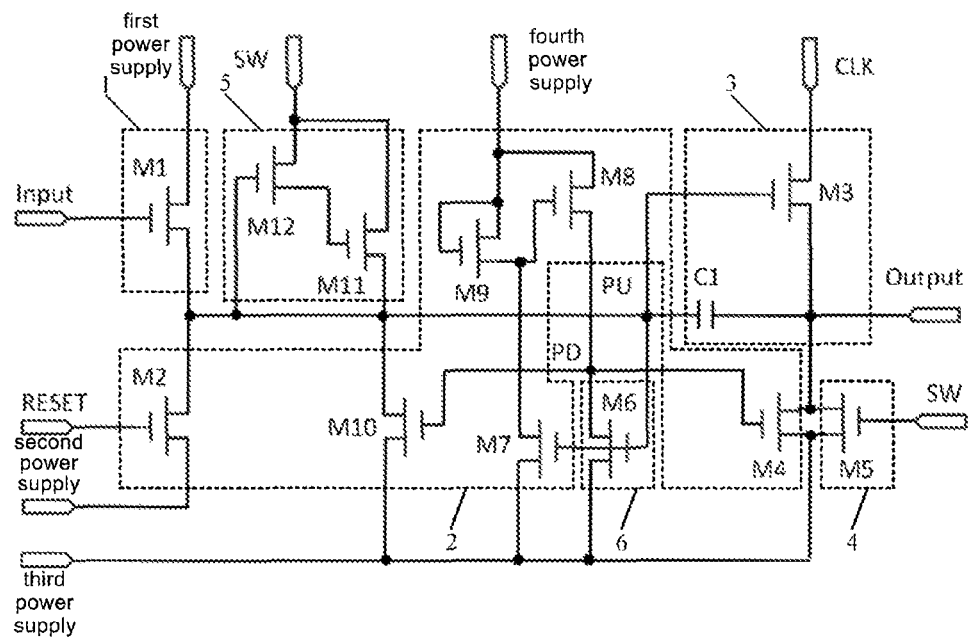
FIG. 2 is a circuit diagram of the shift register unit according to the second embodiment of the present disclosure.

As shown in FIG. 2, which is a circuit diagram of the shift register unit according to the second embodiment of the present disclosure, the precharging module 1 includes a first transistor M1, a gate electrode of which is connected to a signal input end Input, a first electrode of which is connected to a first power supply, and a second electrode of which is connected to the pull-up node PU.

In this embodiment, the resetting module 2 includes a second transistor M2, a fourth transistor M4, a seventh transistor M7, an eighth transistor M8, a ninth transistor M9 and a tenth transistor M10. A gate electrode of the second transistor M2 is connected to a resetting signal end RESET, a first electrode thereof is connected to the pull-up node PU, and a second electrode thereof is connected to a second power supply. A gate electrode of the fourth transistor M4 is connected to the pull-down node PD, a first electrode thereof is connected to the pull-up control module 3, the output end Output and the noise reduction module 4, and a second electrode thereof is connected to a third power supply and the noise reduction module 4. A gate electrode of the seventh transistor M7 is connected to the pull-up node PU, a first electrode thereof is connected to a gate electrode of the eighth transistor M8 and a second electrode of the ninth transistor M9, and a second electrode thereof is connected to the third power supply. The gate electrode of the eighth transistor M8 is connected to the second electrode of the ninth transistor M9, a first electrode thereof is connected to a fourth power supply and a gate electrode of the ninth transistor M9, and a second electrode thereof is connected to the pull-down node PD. The gate electrode of the ninth transistor M9 is connected to a first electrode of the ninth transistor M9 and the fourth power supply. A gate electrode of the tenth transistor M10 is connected to the pull-down node PD, a first electrode thereof is connected to the pull-up node PU, and a second electrode thereof is connected to the third power supply.

In this embodiment of the present disclosure, the pull-up control module 3 includes a third transistor M3 and a capacitor C1. A gate electrode of the third transistor M3 is connected to the pull-up node PU, a first electrode thereof is connected to a clock signal end CLK, and a second electrode thereof is connected to a second end of the capacitor C1, the output end Output and the noise reduction module 4. A first end of the capacitor C1 is connected to the pull-up node PU, and the second end thereof is connected to the output end Output, the resetting module 2 and the noise reduction module 4.

In this embodiment of the present disclosure, the noise reduction module 4 includes a fifth transistor M5, a gate electrode of which is connected to a switch power supply SW, a first electrode of which is connected to the resetting module 2, the output end Output and the pull-up control module 3, and a second electrode of which is connected to the resetting module 2 and the third power supply.

In this embodiment of the present disclosure, the compensation module 5 includes an eleventh transistor M11 and a twelfth transistor M12. A gate electrode of the eleventh transistor M11 is connected to a second electrode of the twelfth transistor M12, a first electrode thereof is connected to the switch power supply SW and a first electrode of the twelfth transistor M12, and a second electrode thereof is connected to the pull-up node PU. A gate electrode of the twelfth transistor M12 is connected to the pull-up node PU, and the first electrode thereof is connected to the switch power supply SW.

In this embodiment of the present disclosure, the pull-down control module 6 includes a sixth transistor M6, a gate electrode of which is connected to the pull-up node PU, a first electrode of which is connected to the pull-down node PD, and a second electrode of which is connected to the third power supply.

To be specific, the first electrode of the fourth transistor M4 is connected to the first electrode of the fifth transistor M5, the second electrode of the third transistor M3, the second end of the capacitor C1 and the output end Output, and the second electrode of the fourth transistor M4 is connected to the second electrode of the fifth transistor M5 and the third power supply. The gate electrode of the tenth transistor M10 is connected to the pull-down node PD. The second electrode of the third transistor M3 is connected to the first electrode of the fourth transistor M4, the first electrode of the fifth transistor M5, the second end of the capacitor C1, and the output end Output. The second end of the capacitor C1 is connected to the first electrode of the fourth transistor M4, the first electrode of the fifth transistor M5, and the output end Output.

An operation procedure of the shift register unit will be described hereinafter in conjunction with FIGS. 3-5.

The shift register units in this embodiment may be connected in a cascaded manner so as to form a gate driver circuit, and they may be used to drive gate lines in two modes.

Figure 3:
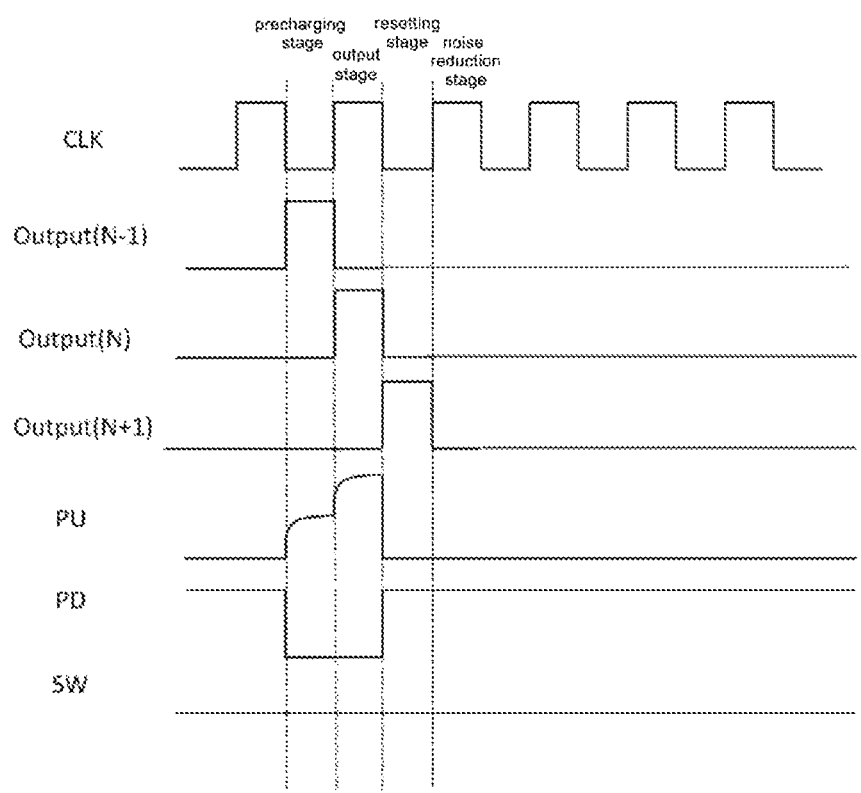
FIG. 3 is a time sequence diagram of the shift register unit in FIG. 2 during forward scanning in a first mode according to one embodiment of the present disclosure.

FIG. 3 is a time sequence diagram of the shift register unit in FIG. 2 during forward scanning in a first mode. As shown in FIGS. 2 and 3, the first mode is a compatible mode, and includes the precharging stage, the output stage, the resetting stage and the noise reduction stage.

At the precharging stage, the first transistor M1 is turned on under the control of an input signal from a signal input end Input(N). The input signal from the signal input end Input(N) is an output signal from an output end Output(N−1) of a previous-level shift register, and this output signal is a high level signal. A clock signal from the clock signal output end CLK is a low level signal. Because the first transistor M1 is in an on state, the capacitor C1 is charged by the first power supply through the first transistor M1, so as to pull up the potential at the pull-up node PU. At this time, a voltage VDD from the first power supply is at a high level. The third transistor M3, the sixth transistor M6 and the seventh transistor M7 are turned on under the control of a voltage at the pull-up node PU, and at this time, the voltage at the pull-up node PU is at a high level. The seventh transistor M7 is in the on state, so that a voltage at the gate electrode of the eighth transistor M8 is a voltage VGL from the third power supply. The eighth transistor M8 is turned off under the control of the voltage VGL from the third power supply, and at this time, the voltage VGL from the third power supply is at a low level. The sixth transistor M6 is in the on state, so that a voltage at the pull-down node is the voltage from the third power supply. Because the voltage VGL from the third power supply is at a low level, the voltage at the pull-down node PD is at a low level too, and the fourth transistor M4 and the tenth transistor M10 are turned off under the control of the voltage at the pull-down node PD. The fifth transistor M5 is turned off under the control of a voltage from the switch power supply SW, and at this time, the voltage from the switch power supply SW is at a low level. The fourth transistor M4, the fifth transistor M5 and the tenth transistor M10 are in the off states, so it is able to ensure the output end Output to output a signal in a stable manner.

At the output stage, the fifth transistor M5 is turned off under the control of the voltage from the switch power supply SW, and at this time, the voltage from the switch power supply SW is at a low level. The twelfth transistor M12 is turned on under the control of the voltage at the pull-up node PU, and the eleventh transistor M11 is turned off under the control of the voltage from the switch power supply SW. At this time, the first transistor M1 is turned off under the control of the input signal from a signal input end Input (N). The input signal from the signal input end Input(N) is an output signal from an output end Output(N−1) of a previous-level shift register unit, and this output signal is a low level signal. The voltage at the pull-up node PU is maintained at a high level, so the third transistor M3 is maintained in the on state under the control of the voltage at the pull-up node PU. At this time, the clock signal from the clock signal output CLK is at a high level, so the voltage at the pull-up node PU is amplified due to a bootstrapping effect, so as to output a driving signal through the output end Output. At this time, the sixth transistor M6 and the seventh transistor M7 are still in the on states under the control of the voltage at the pull-up node PU, so the fourth transistor M4 and the tenth transistor M10 are still in the off states, and the fifth transistor M5 is still in the off state under the control of the voltage from the switch power supply SW. As a result, it is able to ensure the output end Output to output a signal in a stable manner.

At the resetting stage, the second transistor M2 is turned on under the control of a resetting signal from the resetting signal end RESET. The resetting signal from the resetting signal end RESET is an output signal from an output end Output(N+1) of a next-level shift register unit, and this output signal is a high level signal. After the second transistor M2 is in the on state, the voltage at the pull-up node PU is pulled down to a voltage VSS from the second power supply under the effect of the voltage from the second power supply. At this time, the voltage VSS from the second power supply is at a low level, so the voltage at the pull-up node PU is at a low level too, so as to turn off the third transistor M3, the sixth transistor M6 and the seventh transistor M7. The ninth transistor M9 and the eighth transistor M8 are turned on under the control of a voltage VGH from the fourth power supply, and the voltage VGH from the fourth power supply is at a high level, so as to pull up the voltage at the pull-down node PD to be at a high level. The fourth transistor M4 and the tenth transistor M10 are turned on under the control of the pull-down node PD, so as to pull down the voltage at the pull-up node PU to the voltage VGL from the third power supply through the tenth transistor M10 and pull down the voltage at the output end Output to the voltage VGL from the third power supply through the fourth transistor M4. At this time, the voltage VGL from the third power supply is at a low level.

At the noise reduction stage, the output end Output does not output any signal, and the first transistor M1 is maintained in the off state. The eighth transistor M8 and the ninth transistor M9 are maintained in the on states, so as to maintain the pull-down node PD at a high level in the case that the output end Output does not output any signal, and enable the fourth transistor M4 and the tenth transistor M10 to be in the on states. At this time, the tenth transistor M10 is configured to continuously perform noise reduction on the pull-up node PU, and the fourth transistor M4 is configured to continuously perform noise reduction on the output end Output. Due to the noise reduction, it is able to eliminate a coupling noise generated at the clock signal end, thereby to output a signal in a stable manner.

Prior to displaying a next image frame, the noise reduction stage may be repeated by the shift register unit so as to perform the noise reduction. After s current frame is ended and before the next frame is started, i.e., at a vertical blanking (V-blanking) stage, the fifth transistor M5 is turned on under the control of the voltage from the switch power supply SW, so as to perform the noise reduction on the output end Output. At this time, the voltage from the switch power supply SW is at a high level. However, because the voltage at the pull-up node PU is at a low level, the twelfth transistor M12 is turned off under the control of the voltage at the pull-up node PU, so as to turn off the eleventh transistor M11. In the case that the touch function needs to be performed, a touch operation may also be performed at the V-blanking stage. The noise reduction is performed continuously on the output end Output at the V-blanking stage, so it is able to prevent the driving signal of the output end from interfering with the touch signal. As mentioned above, the compatible mode may be a V-blanking mode in which the touch operation is performed at the V-blanking stage. In addition, in the case that the touch operation is not executed by the display device, the compatible mode may also be a display mode in which no touch operation is made. In a word, the compatible mode may include both the display mode and the V-blanking mode, so it may include a conventional gate driving mode in which no touch operation is made and another gate driving mode in which the touch operation is made at the V-blanking stage. The V-blanking stage is not shown in the drawings.

Figure 4:
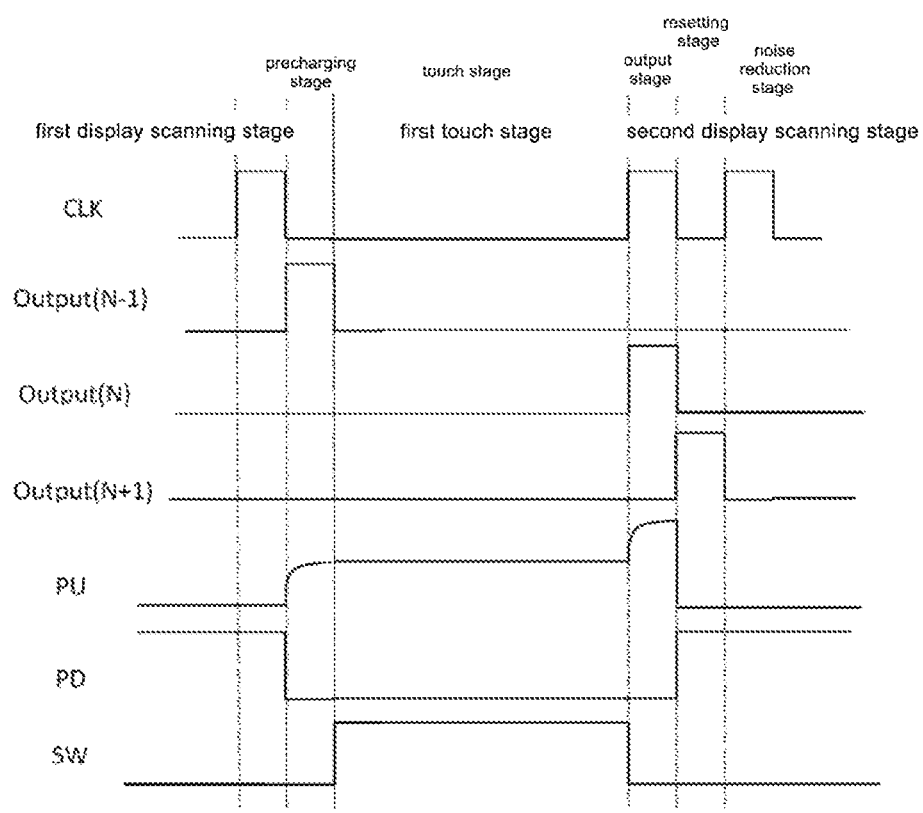
FIG. 4 is another time sequence diagram of the shift register unit in FIG. 2 during forward scanning in a second mode according to one embodiment of the present disclosure.

FIG. 4 is another time sequence diagram of the shift register unit in FIG. 2 during forward scanning in a second mode. As shown in FIGS. 2 and 4, the second mode is a horizontal blanking (H-blanking) mode, and it may include the precharging stage, the touch stage, the output stage, the resetting stage and the noise reduction stage.

At the precharging stage, the first transistor M1 is turned on under the control of an input signal from a signal input end Input(N). The input signal from the signal input end Input(N) is an output signal from an output end Output(N−1) of a previous-level shift register unit, and this output signal is a high level signal. A clock signal from the clock signal end CLK is a low level signal. Because the first transistor M1 is in the on state, the capacitor C1 is charged by the first power supply through the first transistor M1, so as to pull up the voltage at the pull-up node PU. At this time, a voltage VDD from the first power supply is at a high level. The third transistor M3, the sixth transistor M6 and the seventh transistor M7 are turned on under the control of the voltage at the pull-up node PU, and at this time, the voltage at the pull-up node PU is at a high level. The seventh transistor M7 is turned on, so as to enable a voltage at the gate electrode of the eighth transistor M8 to be the voltage VGL from the third power supply, and turn off the eighth transistor M8 under the control of the voltage VGL from the third power supply. At this time, the voltage VGL from the third power supply is at a low level. The sixth transistor M6 is in the on state, so that the voltage at the pull-down node PD is the voltage VGL from the third power supply. Because the voltage VGL from the third power supply is at a low level, the voltage at the pull-down node PD is also at a low level, and the fourth transistor M4 and the tenth transistor M10 are turned off under the control of the voltage at the pull-down node PD. The fifth transistor M5 is turned off under the control of the voltage from the switch power supply SW, and at this time, the voltage from the switch power supply SW is at a low level. The fourth transistor M4, the fifth transistor M5 and the tenth transistor M10 are in the off states, and as a result, it is able to ensure the output end Output to output a signal in a stable manner.

At the touch stage, i.e., the H-blanking stage, the voltage at the pull-up node PU is maintained at a high level. The twelfth transistor M12 is turned on under the control of the voltage at the pull-up node PU, the eleventh transistor M11 is turned on under the control of the voltage from the switch power supply SW, and the voltage from the switch power supply SW is at a high level. The fifth transistor M5 is turned on under the control of the voltage from the switch power supply SW, so as to perform noise reduction on the output end Output(N), thereby to prevent the output end Output(N) from outputting the driving signal. As a result, it is able to prevent the driving signal from interfering with the touch signal, thereby to achieve the touch function. Because the eleventh transistor M11 is in the on state, the pull-up node PU may be charged additionally by the switch power supply SW, so as to maintain the voltage at the pull-up node PU to be at a high level without decreasing. The pull-up node PU is charged by the switch power supply SW merely through the eleventh transistor M11, so as to improve a charging effect of the compensation module. As shown in FIG. 5 which is a time sequence diagram of the shift register unit in the case of no compensation for the pull-up node, because there is current leakage at the second transistor M2 and the tenth transistor M10, the voltage at the pull-up node PU may be pulled down in the case that the pull-up node PU is not charged additionally. At this time, after the touch operation is ended, no driving signal may be outputted or the voltage of the outputted driving signal may be too low. By comparing FIG. 4 with FIG. 5, after the pull-up node PU is charged additionally in FIG. 4, the voltage at the pull-up node PU may be maintained at a high level without decreasing. In addition, the voltage at the pull-up nodes PU of the shift register units corresponding to the gate lines in the other rows are each at a low level, so the subsequent operation of these shift register units corresponding to the gate lines in the other rows may not be adversely affected.

At the output stage, the fifth transistor M5 is turned off under the control of the voltage from the switch power supply SW, and at this time, the voltage from the switch power supply SW is at a low level. The twelfth transistor M12 is turned on under the control of the voltage at the pull-up node PU, and the eleventh transistor M11 is turned off under the control of the voltage from the switch power supply SW. At this time, the first transistor M1 is turned off under the control of an input signal from a signal input end Input(N). The input signal from the signal input Input(N) is an output signal from an output end Output(N−1) of a previous-level shift register unit, and this output signal is a low level signal. The voltage at the pull-up node PU is maintained at a high level, so the third transistor M3 is maintained in the on state under the control of the voltage at the pull-up node PU. At this time, a clock signal from the clock signal output end CLK is at a high level, so the voltage at the pull-up node PU is amplified due to a bootstrapping effect, so as to output a driving signal through the output end Output. At this time, the sixth transistor M6 and the seventh transistor M7 are still maintained in the on states under the control of the voltage at the pull-up node PU, so the fourth transistor M4 and the tenth transistor M10 are still in the off states and the fifth transistor M5 is still in the off state under the control of the voltage from the voltage from the switch power supply SW. As a result, it is able to ensure the output end Output to output a signal in a stable manner.

At the resetting stage, the second transistor M2 is turned on under the control of a resetting signal from the resetting signal end RESET. The resetting signal from the resetting signal end RESET is an output signal from an output end Output(N+1) of a next-level shift register unit, and this output signal is a high level signal. After the second transistor M2 is turned on, the voltage at the pull-up node PU is pulled down to the voltage VSS from the second power supply under the effect of the voltage from the second power supply. At this time, the voltage VSS from the second power supply is at a low level, so the voltage at the pull-up node PU is at a low level too, and the third transistor M3, the sixth transistor M6 and the seventh transistor M7 are turned off. The ninth transistor M9 and the eighth transistor M8 are turned on under the control of the voltage VGH from the fourth power supply, and the voltage VGH from the fourth power supply is at a high level, so as to pull up the voltage at the pull-down node PD to be at a high level. The fourth transistor M4 and the tenth transistor M10 are turned on under the control of the pull-down node PD, so as to pull down the voltage at the pull-up node PU to the voltage from the third power supply through the tenth transistor M10, and pull down the voltage at the output end Output to the voltage from the third power supply through the fourth transistor M4. At this time, the voltage from the third power supply is at a low level.

At the noise reduction stage, the output end Output does not output any signal, and the first transistor M1 is maintained in the off state. The eighth transistor M8 and the ninth transistor M9 are maintained in the on states, so as to maintain the pull-down node PD at a high level in the case that the output end Output does not output any signal, and enable the fourth transistor M4 and the tenth transistor M10 to be in the on states. At this time, the tenth transistor M10 is configured to continuously perform noise reduction on the pull-up node PU, and the fourth transistor M4 is configured to continuously perform noise reduction on the output end Output. Due to the noise reduction, it is able to eliminate a coupling noise generated at the clock signal end, thereby to output a signal in a stable manner.

Prior to displaying a next image frame, the noise reduction stage may be repeated by the shift register unit so as to perform the noise reduction. After s current frame is ended and before the next frame is started, i.e., at a vertical blanking (V-blanking) stage, the fifth transistor M5 is turned on under the control of the voltage from the switch power supply SW, so as to perform the noise reduction on the output end Output. At this time, the voltage from the switch power supply SW is at a high level. However, because the voltage at the pull-up node PU is at a low level, the twelfth transistor M12 is turned off under the control of the voltage at the pull-up node PU, so as to turn off the eleventh transistor M11. Hence, the H-blanking mode may be applied to a gate driving mode in which the touch operation is performed at the H-blanking stage.

Figure 5:
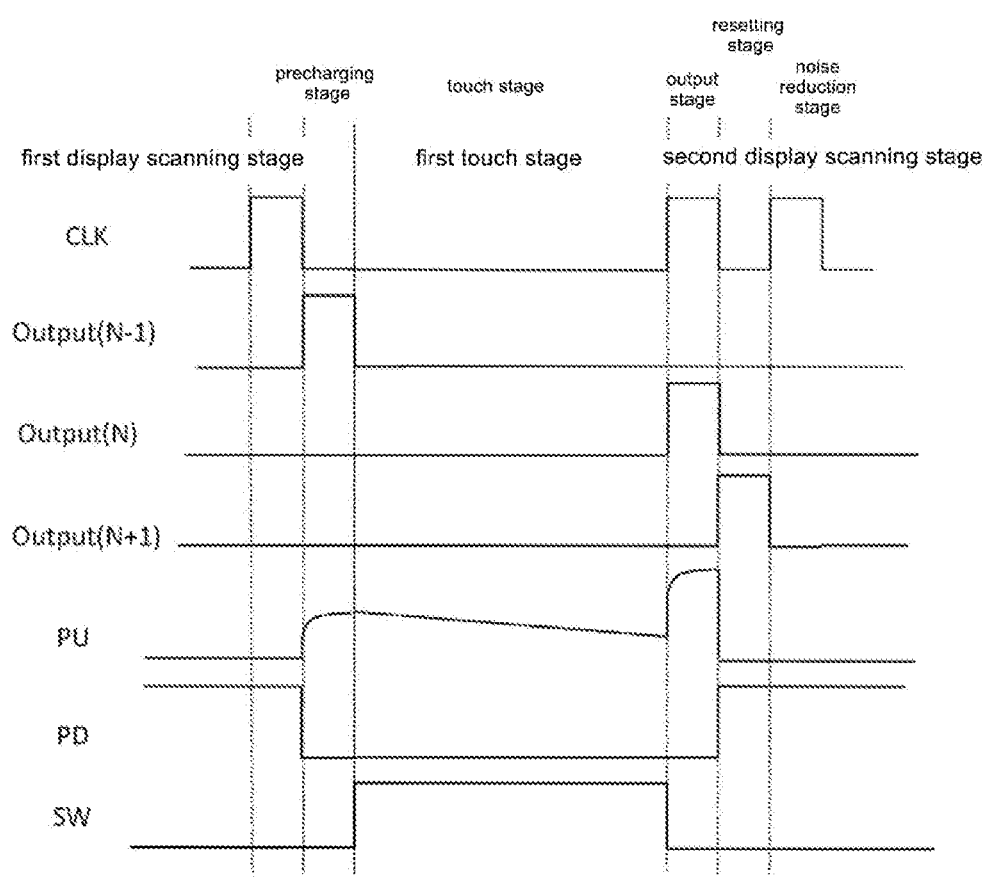
FIG. 5 is yet another time sequence diagram of the shift register unit in the case of no compensation for a pull-up node according to one embodiment of the present disclosure.

It should be appreciated that, as shown in FIGS. 4 and 5, the touch function may be achieved at a certain H-blanking stage during the display operation, and then the display operation may be performed continuously. In FIG. 4, a first touch stage is performed between a first display scanning stage and a second display scanning stage. The precharging stage is performed at the first display scanning stage, and then at the H-blanking stage subsequent to the first display scanning stage, a first touch stage is performed. Then, at the second display scanning stage subsequent to the touch stage, the above-mentioned output stage, resetting stage and noise reduction stage are performed.

According to the shift register unit in the embodiment of the present disclosure, the noise reduction module is configured to perform the noise reduction on the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

Figure 6:
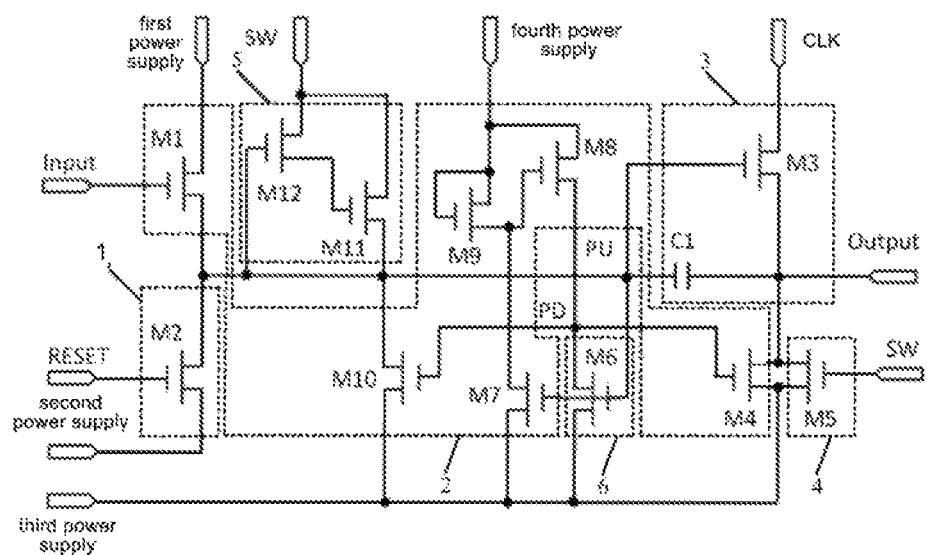
FIG. 6 is another circuit diagram of the shift register unit according to the third embodiment of the present disclosure.

The present disclosure provides in the third embodiment the shift register unit for backward scanning. During the forward scanning and the backward scanning, the structure of the shift register unit is not changed, and instead, functions of the signal input end and the resetting signal end are exchanged, i.e., a function of the first transistor of the precharging module and a function of the second transistor of the resetting module are replaced with each other. To be specific, during the forward scanning, the voltage VDD from the first power supply is at a high level, and the voltage VSS from the second power supply is at a low level. During the backward scanning, the voltage VSS from the first power supply is at a low level, and the voltage VDD from the second power supply is at a high level. The signal input end Input for the forward scanning serves as the resetting signal end RESET for the backward scanning, and the resetting signal end RESET for the forward scanning serves as the signal input end Input for the backward scanning. As shown in FIG. 6 which is a schematic view showing the shift register unit according to the third embodiment of the present disclosure, the precharging module 1 includes a second transistor M2, a gate electrode of which is connected to the resetting signal end RESET, a first electrode of which is connected to the pull-up node PU, and a second electrode of which is connected to the second power supply.

In this embodiment of the present disclosure, the resetting module 2 includes a first transistor M1, a fourth transistor M4, a seventh transistor M7, an eighth transistor M8, a ninth transistor M9 and a tenth transistor M10. A gate electrode of the first transistor M1 is connected to the signal input end Input, a first electrode thereof is connected to the first power supply, and a second electrode thereof is connected to the pull-up node PU.

The connection relationship among the other structures in this embodiment may refer to that in the first embodiment, and thus will not be particularly defined herein.

In this embodiment of the present disclosure, the shift register units may be connected in a cascaded manner so as to form a gate driver circuit. And they may be used to drive gate lines in two modes. A first mode is a compatible mode, and includes the precharging stage, the output stage, the resetting stage and the noise reduction stage.

At the precharging stage, the second transistor M2 is turned on under the control of a resetting signal from the resetting signal end RESET. The resetting signal from the resetting signal end RESET is an output signal from the output end Output(N+1) of a next-level shift register unit, and this output signal is a high level signal. A clock signal from the clock signal end CLK is a low level signal. Because the second transistor M2 is in the on state, so the capacitor C1 is charged by the second power supply through the second transistor M2, so as to pull up the voltage at the pull-up node PU. At this time, the voltage VDD from the second power supply is at a high level. At the precharging stage, the operation procedure of the other structures may refer to that in the first embodiment, and thus will not be particularly defined herein.

At the output stage, the second transistor M2 is turned off under the control of the resetting signal from the resetting signal end RESET. The resetting signal from the resetting signal end RESET is an output signal from the output end Output(N+1) of a next-level shift register unit, and this output signal is a low level signal. At the output stage, the operation procedure of the other structures may refer to that in the first embodiment, and thus will not be particularly defined herein.

At the resetting stage, the first transistor M1 is turned on under the control of the input signal from the signal input end Input(N). The input signal from the input signal end Input(N) is an output signal from an output end Output(N−1) of a previous-level shift register unit, and this output signal is a high level signal. After the first transistor M1 is in the on state, the voltage at the pull-up node PU is pulled down to the voltage VSS from the first power supply under the effect of the voltage from the first power supply. At this time, the voltage VSS from the first power supply is at a low level, so the voltage at the pull-up node PU is at a low level too, and the third transistor M3, the sixth transistor M6 and the seventh transistor M7 are turned off. At the resetting stage, the operation procedure of the other structures may refer to that in the first embodiment, and thus will not be particularly defined herein.

Prior to displaying a next frame, the noise reduction stage may be repeated by the shift register unit so as to perform the noise reduction. After s current frame is ended and before the next frame is started, i.e., at a V-blanking stage, the fifth transistor M5 is turned on under the control of the voltage from the switch power supply SW, so as to perform the noise reduction on the output end Output. At this time, the voltage from the switch power supply SW is at a high level. However, because the voltage at the pull-up node PU is at a low level, the twelfth transistor M12 is turned off under the control of the voltage at the pull-up node PU, so as to turn off the eleventh transistor M11. In the case that the touch function needs to be performed, a touch operation may also be performed at the V-blanking stage. The noise production is performed continuously on the output end Output at the V-blanking stage, so it is able to prevent the driving signal of the output end from interfering with the touch signal. As mentioned above, the compatible mode may be a V-blanking mode in which the touch operation is performed at the V-blanking stage. In addition, in the case that the touch operation is not executed by the display device, the compatible mode may also be a display mode in which no touch operation is made. In a word, the compatible mode may include both the display mode and the V-blanking mode, so it may include a conventional gate driving mode in which no touch operation is made and another gate driving mode in which the touch operation is made at the V-blanking stage.

A second mode is an H-blanking mode, and it may include the precharging stage, the touch stage, the output stage, the resetting stage and the noise reduction stage. In the second mode, the operation procedures for the precharging stage, the output stage, the resetting stage and the noise reduction stage are identical to those in the first mode, and thus will not be particularly defined herein. The touch stage in this embodiment differs from the touch stage in the first embodiment in that, the pull-up node PU needs to be charged additionally because there is current leakage at the first transistor M1 and the tenth transistor M10.

Prior to displaying a next frame, the noise reduction stage may be repeated by the shift register unit so as to perform the noise reduction. After s current frame is ended and before the next frame is started, i.e., at a vertical blanking (V-blanking) stage, the fifth transistor M5 is turned on under the control of the voltage from the switch power supply SW, so as to perform the noise reduction on the output end Output. At this time, the voltage from the switch power supply SW is at a high level. However, because the voltage at the pull-up node PU is at a low level, the twelfth transistor M12 is turned off under the control of the voltage at the pull-up node PU, so as to turn off the eleventh transistor M11. Hence, the H-blanking mode may be applied to a gate driving mode in which the touch operation is performed at the H-blanking stage.

According to the shift register unit in the embodiment of the present disclosure, the noise reduction module is configured to perform noise reduction on the output end at the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

Figure 7:
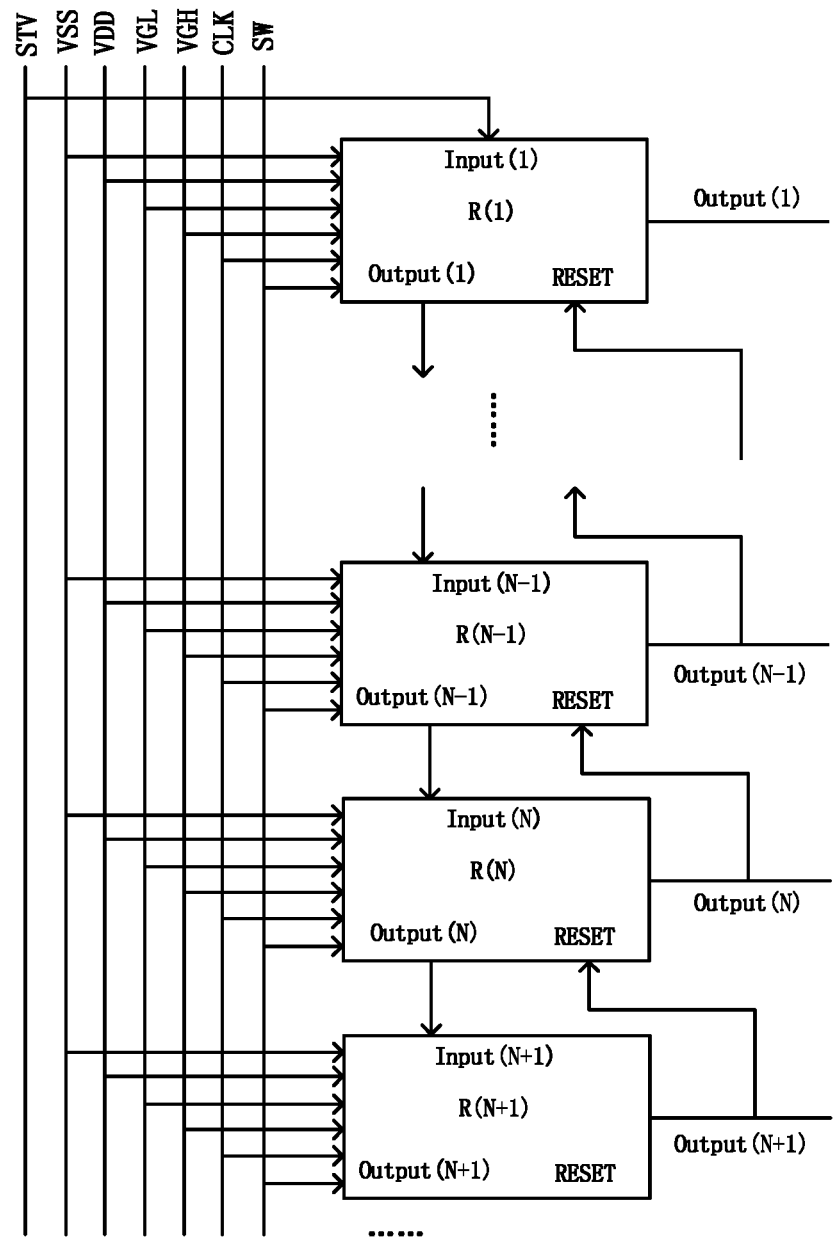
FIG. 7 is a schematic view showing a gate driver circuit according to the fourth embodiment of the present disclosure.

As shown in FIG. 7 which is a schematic view showing a gate driver circuit according to the fourth embodiment of the present disclosure, the gate driver circuit includes a plurality of shift register units connected in a cascaded manner.

A start signal STV is inputted to an input end of a first-level shift register unit R(1). Apart from the first-level shift register unit R(1), an input end of a current-level shift register unit is connected to an output end of a previous-level shift register unit, e.g., an input end Input(N) of an $N^{th}$-level shift register unit R(N) is connected to an output end Output(N−1) of an $(N-1)^{th}$-level shift register unit R(N−1). A resetting end RESET of a last-level shift register unit (not shown) is configured to receive a reset signal. Apart from the last-level shift register unit, a resetting end of a current-level shift register unit is connected to an output end of a next-level shift register unit, e.g., a resetting end of an $N^{th}$-level shift register unit R(N) is connected to an output end Output(N+1) of an $(N+1)^{th}$-level shift register unit R(N+1).

The shift register units in this embodiment may be that mentioned in the first embodiment, the second embodiment or the third embodiment.

According to the gate driver circuit in the embodiment of the present disclosure, the noise reduction module is configured to perform the noise reduction on the output end at the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

The present disclosure provides in the fifth embodiment a display device including the gate driver circuit in the fourth embodiment.

According to the display device in the embodiment of the present disclosure, the noise reduction module is configured to perform the noise reduction on the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

The present disclosure further provides in the sixth embodiment a method for driving a shift register unit, which includes: Step 101 of, at a precharging stage, charging, by a precharging module, a pull-up node; Step 102 of, at an output stage, pulling up, by a pull-up control module, a potential at the pull-up node, and outputting a driving signal through an output end; and Step 103 of, at a resetting stage, resetting, by a resetting module, the pull-up node and the output end, and at a noise reduction stage, performing noise reduction on the pull-up node and the output end; and Step 104 of, at a touch stage, performing, by a noise reduction module, noise reduction on the output end. The touch stage is a V-blanking stage.

The method in this embodiment may be applied to the shift register unit in the above-mentioned first embodiment, second embodiment or third embodiment.

According to the driving method in this embodiment of the present disclosure, the noise reduction module is configured to perform the noise reduction on the output end at the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

The present disclosure further provides in the seventh embodiment a method for driving a shift register unit, which includes: Step 201 of, at a precharging stage, charging, by a precharging module, a pull-up node; Step 202 of, at a touch stage, performing, by a noise reduction module, on an output end; Step S203 of, at an output stage, pulling up, by a pull-up control module, a potential at the pull-up node, and outputting a driving signal through the output end; and Step 204 of, at a resetting stage, resetting, by a resetting module, the pull-up node and the output end, and at a noise reduction stage, performing noise reduction on the pull-up node and the output end. The touch stage is an H-blanking stage.

The method in this embodiment may be applied to the shift register unit in the above-mentioned first embodiment, second embodiment or third embodiment.

According to the driving method in this embodiment of the present disclosure, the noise reduction module is configured to perform the noise reduction on the output end at the touch stage, so as to prevent the driving signal of the output end from interfering with the touch signal, thereby to prevent the touch function of the display device from being adversely affected. The pull-up node is charged by the compensation module at the touch stage, so as to prevent the voltage at the pull-up node from being reduced, thereby to avoid no driving signal being outputted after the touch operation or prevent the voltage of the driving signal from being too low.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A shift register unit, comprising a precharging module, a resetting module, a pull-up control module, and a noise reduction module, wherein
   the precharging module is connected to the resetting module and a pull-up node, the resetting module is connected to the pull-up node, the noise reduction module, and an output end, the pull-up control module is connected to the pull-up node, the noise reduction module, and the output end, and the noise reduction module is connected to the output end;
   the precharging module is configured to charge the pull-up node at a precharging stage;
   the noise reduction module is configured to perform noise reduction on the output end at a touch stage;
   the pull-up control module is configured to pull up a potential at the pull-up node and output a driving signal through the output end at an output stage; and
   the resetting module is configured to reset the pull-up node and the output end at a resetting stage, and perform noise reduction on the pull-up node and the output end at a noise reduction stage,
   wherein the shift register unit further comprises a compensation module connected to the pull-up node and configured to charge the pull-up node at the touch stage.

2. The shift register unit according to claim 1, further comprising a pull-down control module connected to the pull-up node, a pull-down node, and the resetting module, and configured to pull down a potential at the pull-down node.

3. The shift register unit according to claim 2, wherein the pull-down control module comprises a sixth transistor, a gate electrode of the sixth transistor is connected to the pull-up node, a first electrode of the sixth transistor is connected to the pull-down node, and a second electrode of the sixth transistor is connected to a third power supply.

4. The shift register unit according to claim 1, further comprising a pull-down control module connected to the pull-up node, a pull-down node, and the resetting module, and configured to pull down a potential at the pull-down node.

5. The shift register unit according to claim 4, wherein the pull-down control module comprises a sixth transistor, a gate electrode of the sixth transistor is connected to the pull-up node, a first electrode of the sixth transistor is connected to the pull-down node, and a second electrode of the sixth transistor is connected to a third power supply.

6. The shift register unit according to claim 1, wherein during forward scanning, the precharging module comprises a first transistor, a gate electrode of the first transistor is connected to a signal input end, a first electrode of the first transistor is connected to a first power supply, and a second electrode of the first transistor is connected to the pull-up node.

7. A gate driver circuit, comprising a plurality of shift register units according to claim 1 and connected in a cascaded manner.

8. The gate driver circuit according to claim 7, wherein a start signal is inputted to an input end of a first-level shift register unit;
   apart from the first-level shift register unit, an input end of a current-level shift register unit is connected to an output end of a previous-level shift register unit, and a resetting end RESET of a last-level shift register unit is configured to receive a reset signal; and
   apart from the last-level shift register unit, a resetting end of a current-level shift register unit is connected to an output end of a next-level shift register unit.

9. A display device, comprising the gate driver circuit according to claim 8.

10. The shift register unit according to claim 1, wherein during forward scanning, the resetting module comprises a second transistor, a fourth transistor, a seventh transistor, an eighth transistor, a ninth transistor, and a tenth transistor;
    a gate electrode of the second transistor is connected to a resetting signal end, a first electrode of the second transistor is connected to the pull-up node, and a second electrode of the second transistor is connected to a second power supply;
    a gate electrode of the fourth transistor is connected to a pull-down node, a first electrode of the fourth transistor is connected to the pull-up control module, the output end, and the noise reduction module, and a second electrode of the fourth transistor is connected to a third power supply and the noise reduction module;

a gate electrode of the seventh transistor is connected to the pull-up node, a first electrode the seventh transistor is connected to a gate electrode of the eighth transistor and a second electrode of the ninth transistor, and a second electrode the seventh transistor is connected to the third power supply;

the gate electrode of the eighth transistor is connected to the second electrode of the ninth transistor, a first electrode of the eighth transistor is connected to a fourth power supply and a gate electrode of the ninth transistor, and a second electrode of the eighth transistor is connected to the pull-down node;

the gate electrode of the ninth transistor is connected to a first electrode of the ninth transistor and the fourth power supply; and a gate electrode of the tenth transistor is connected to the pull-down node, a first electrode of the tenth transistor is connected to the pull-up node, and a second electrode of the tenth transistor is connected to the third power supply.

11. The shift register unit according to claim 1, wherein during backward scanning, the precharging module comprises a second transistor, a gate electrode of the second transistor is connected to a resetting signal end, a first electrode of the second transistor is connected to the pull-up node, and a second electrode of the second transistor is connected to a second power supply.

12. The shift register unit according to claim 1, wherein during backward scanning, the resetting module comprises a first transistor, a fourth transistor, a seventh transistor, an eighth transistor, a ninth transistor, and a tenth transistor;

a gate electrode of the first transistor is connected to a signal input end, a first electrode of the first transistor is connected to a first power supply, and a second electrode of the first transistor is connected to the pull-up node;

a gate electrode of the fourth transistor is connected to a pull-down node, a first electrode of the fourth transistor is connected to the pull-up control module, the output end and the noise reduction module, and a second electrode of the fourth transistor is connected to a third power supply and the noise reduction module;

a gate electrode of the seventh transistor is connected to the pull-up node, a first electrode of the seventh transistor is connected to a gate electrode of the eighth transistor and a second electrode of the ninth transistor, and a second transistor of the seventh transistor is connected to the third power supply;

the gate electrode of the eighth transistor is connected to the second electrode of the ninth transistor, a first electrode of the eighth transistor is connected to a fourth power supply and a gate electrode of the ninth transistor, and a second electrode of the eighth transistor is connected to the pull-down node;

the gate electrode of the ninth transistor is connected to a first electrode of the ninth transistor and the fourth power supply; and a gate electrode of the tenth transistor is connected to the pull-down node, a first electrode of the tenth transistor is connected to the pull-up node, and a second electrode of the tenth transistor is connected to the third power supply.

13. The shift register unit according to claim 1, wherein the pull-up control module comprises a third transistor and a capacitor;

a gate electrode of the third transistor is connected to the pull-up node, a first electrode of the third transistor is connected to a clock signal end, and a second electrode of the third transistor is connected to a second end of the capacitor, the output end, and the noise reduction module; and a first end of the capacitor is connected to the pull-up node, and the second end of the capacitor is connected to the output end, the resetting module, and the noise reduction module.

14. The shift register unit according to claim 1, wherein the noise reduction module comprises a fifth transistor, a gate electrode of the fifth transistor is connected to a switch power supply, a first electrode of the fifth transistor is connected to the resetting module, the output end, and the pull-up control module, and a second electrode of the fifth transistor is connected to the resetting module and a third power supply.

15. The shift register unit according to claim 1, wherein the compensation module comprises an eleventh transistor and a twelfth transistor;

a gate electrode of the eleventh transistor is connected to a second electrode of the twelfth transistor, a first electrode of the eleventh transistor is connected to a switch power supply and a first electrode of the twelfth transistor, and a second electrode of the eleventh transistor is connected to the pull-up node; and a gate electrode of the twelfth transistor is connected to the pull-up node, and the first electrode of the twelfth transistor is connected to the switch power supply.

16. A method for driving a shift register unit, wherein the shift register unit includes a precharging module, a noise reduction module, a pull-up control module, and resetting module, the method comprising:

at a precharging stage, charging, by the precharging module, a pull-up node;

at a touch stage, performing, by the noise reduction module, noise reduction on an output end;

at an output stage, pulling up, by the pull-up control module, a potential at the pull-up node, and outputting a driving signal through the output end; and at a resetting stage, resetting, by the resetting module, the pull-up node and the output end, and at a noise reduction stage, performing noise reduction on the pull-up node and the output end, wherein the shift register unit further includes a compensation module connected to the pull-up node; and the method further comprises:

charging, by the compensation module, the pull-up node at the touch stage.

17. The method according to claim 16, wherein the touch stage is a horizontal blanking stage.

18. A method for driving a shift register unit, wherein the shift register unit includes a precharging module, a noise reduction module, a pull-up control module, and resetting module, the method comprising:

at a precharging stage, charging, by the precharging module, a pull-up node;

at an output stage, pulling up, by the pull-up control module, a potential at the pull-up node, and outputting a driving signal through an output end;

at a resetting stage, resetting, by the resetting module, the pull-up node and the output end, and at a noise reduction stage, performing noise reduction on the pull-up node and the output end; and at a touch stage, performing, by the noise reduction module, on the output end, wherein the shift register unit further includes a compensation module connected to the pull-up node; and the method further comprises:
charging, by the compensation module, the pull-up node at the touch stage.

19. The method according to claim 18, wherein the touch stage is a vertical blanking stage.

* * * * *